United States Patent
Kuo et al.

(10) Patent No.: US 7,817,472 B2
(45) Date of Patent: Oct. 19, 2010

(54) OPERATING METHOD OF MEMORY DEVICE

(75) Inventors: Ming-Chang Kuo, Hsinchu (TW); Ming-Hsiu Lee, Hsinchu (TW); Chao-I Wu, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 169 days.

(21) Appl. No.: 12/169,155

(22) Filed: Jul. 8, 2008

(65) Prior Publication Data
US 2009/0207658 A1    Aug. 20, 2009

Related U.S. Application Data

(63) Continuation-in-part of application No. 12/031,189, filed on Feb. 14, 2008.

(51) Int. Cl.
    *G11C 16/04* (2006.01)
(52) U.S. Cl. .............................. 365/185.12; 365/185.17
(58) Field of Classification Search ............ 365/185.12, 365/185.17, 185.28, 185.03
    See application file for complete search history.

(56) References Cited

U.S. PATENT DOCUMENTS

| | | | |
|---|---|---|---|
| 6,143,607 A | 11/2000 | Chi | |
| 6,747,899 B2 * | 6/2004 | Hsia et al. | 365/185.28 |
| 6,788,573 B2 | 9/2004 | Choi | |
| 6,885,585 B2 | 4/2005 | Maayan et al. | |
| 6,922,363 B2 | 7/2005 | Hsu et al. | |
| 7,136,306 B2 | 11/2006 | Xue et al. | |
| 7,317,654 B2 * | 1/2008 | Kim et al. | 365/230.06 |
| 2006/0171209 A1 | 8/2006 | Sim et al. | |
| 2006/0209596 A1 * | 9/2006 | Li | 365/185.17 |

FOREIGN PATENT DOCUMENTS

TW     I220252    2/2005

* cited by examiner

*Primary Examiner*—Vu A Le
(74) *Attorney, Agent, or Firm*—J.C. Patents (57) ABSTRACT

An operating method of a memory array is provided. The operating method includes performing a programming operation. The programming operation is performed by applying a first voltage to a bit line of the memory array and a second voltage to a plurality of word lines of the memory array to cause simultaneously programming a plurality of selected memory cells in the memory array.

15 Claims, 8 Drawing Sheets

OPERATING METHOD OF MEMORY DEVICE

CROSS-REFERENCE TO RELATED APPLICATION

This application is a continuation-in-part of a prior application Ser. No. 12/031,189, filed Feb. 14, 2008. The entirety of the above-mentioned patent application is hereby incorporated by reference herein and made a part of this specification.

BACKGROUND

1. Field of Invention

The present invention relates to an operation method an electrically erasable and programmable read-only memory device.

2. Description of Related Art

Electrically erasable programmable read only memory (EEPROM) is a type of non-volatile memory that allows multiple data reading, writing and erasing operations. In addition, the stored data are retained even after the power to the device is terminated. A typical electrically erasable programmable read only memory is a flash memory.

According to the different structural materials, a flash memory can be categorized into doped polysilicon floating gate type of memory device and the charge trapping layer type of memory device. In general, the material of the charge trapping layer is silicon nitride, and above and below the silicon nitride charge trapping layer respectively disposed a layer of silicon oxide. Further, the control gate and the substrate are formed with a polysilicon or silicon type of material. Hence, this type of device is normally known as a silicon/silicon oxide/silicon nitride/silicon oxide/silicon (SONOS) device.

According to the various arrangements, a flash memory can also be categorized into NOR type and NAND type. On the other hand, according to the different functions, a flash memory can be categorized into code flash for programming data and data flash for storing data. A code flash memory device is mainly responsible for providing the turn-on and program control of an electronic product; hence, it is mandated for a code flash to be able to read and retrieve data rapidly. On the other hand, it is mandated for a data flash memory device to be able to write data rapidly.

A typical operating method of a NOR flash memory device includes selecting a single memory cell, applying a bias to the word line corresponding to the control gate of the selected single memory cell and a bias to the bit line corresponding to the drain region, applying 0 volt to other word lines, and applying 0 volt to or floating other bit lines. Accordingly, electrons or holes are injected into the doped polysilicon floating gate or the charge trapping layer via the channel hot electron effect or the channel hot hole effect to alter the threshold voltage. However, the programming operation with this type of cell-by-cell writing method is time consuming; hence, the application thereof to a data flash memory device, which requires the function of writing data rapidly, is inappropriate because the throughput is highly limited. Accordingly, a typical data flash memory device is a NAND flash memory device. On the other hand, a NAND flash memory device normally applies the positive Fowler-Nordehim electron tunneling or the negative Fowler-Nordehim electron tunneling, which is inapplicable in a NOR flash memory device. Therefore, a NOR flash memory device is solely applicable on code flash memory device for providing the turn-on and program control of an electronic product.

SUMMARY OF THE INVENTION

The present invention is to provide an operating method for a NOR flash memory device, wherein the programming time is reduced and the throughput is enhance to be applicable in a data flash memory device.

The present invention is to provide a method for operating a memory device, wherein the memory device includes a plurality memory cells configured in a memory cell array. The operating method includes, during the programming operation, a once-bit-line operating method is applied to select a column/line of memory cells, and the plurality of memory cells corresponding to the selected column/line are concurrently programmed, and the plurality of memory cells are at a plurality of program states simultaneously.

According to an embodiment of the present invention, in the above operating method of a memory device, during the programming of the plurality of the memory cells corresponding to the selected column/line of memory cells, a plurality of predetermined biases is concurrently applied to the corresponding plurality of word lines of the plurality of memory cells of the selected column/line.

According to an embodiment of the present invention, in the above operating method of a memory device, a single-junction-bias method is applied to perform the programming operation, wherein each drain region of each memory cell of the selected column/line of memory cells is applied with a positive voltage, and each source region of each memory cell of the selected column/line is floating.

According to an embodiment of the present invention, in the above operating method of a memory device, a double-side-junction-bias method is applied to perform the programming operation, wherein each drain region and each source region of each memory cell of the selected column/line of memory cells are applied with a positive voltage.

According to an embodiment of the present invention, in the above operating method of a memory device, the above predetermined program states include two different threshold voltage distributions.

According to an embodiment of the present invention, in the above operating method of a memory device, the plurality memory cells are binary cells.

According to an embodiment of the present invention, in the above operating method of a memory device, the plurality of memory cells is multi-level cells, and the above predetermined program states are a plurality of program states having different threshold voltage distributions.

According to an embodiment of the present invention, in the above operating method of a memory device, the memory cell array is a NOR memory cell array.

According to an embodiment of the present invention, in the above operating method of a memory device, the plurality of memory cells is programmed Bit line-by-Bit line.

According to an embodiment of the present invention, the above operating method of a memory device further includes the application of a once-bit-line operating method to perform an erase operation to concurrently erase the memory cells corresponding to the selected memory cell line/column, and the memory cells are at a plurality of predetermined program states simultaneously.

According to an embodiment of the present invention, in the above operating method of a memory device, the once-bit-line operating method for the erase operation includes the application of the single-junction-bias method, the double-side-junction-bias method or the negative Fowler-Nordheim electron tunneling effect.

According to an embodiment of the present invention, in the above operating method of a memory device, during the erase operation of the plurality of the memory cells of the selected column/line of memory cells, a plurality of negative voltages is applied to the plurality of corresponding word lines of the above plurality of memory cells of the selected column/line of memory cells.

According to an embodiment of the present invention, in the above operating method of a memory device, a positive voltage is applied to each drain region of each memory cell of the selected column/line of memory cells and each source region of each memory cell of the selected column/line is floating when the single-junction-bias method is used to perform the erase operation.

According to an embodiment of the present invention, in the above operating method of a memory device, a same positive voltage is applied to each drain region and each source region of each memory cell of the selected column/line of memory cells, when the double-side-junction-bias method is used to perform the erase operation.

According to an embodiment of the present invention, in the above operating method of a memory device, each drain region and each source region of each memory cell of the selected column/line of memory cells are applied with 0 volt when negative Fowler-nordehim electron tunneling is applied to perform the erase operation.

In order to make the aforementioned and other objects, features and advantages of the present invention comprehensible, a preferred embodiment accompanied with figures is described in detail below.

BRIEF DESCRIPTION OF THE DRAWINGS

FIG. 3A-1 is a schematic circuit diagram of a programming operation for a NOR memory cell array according to an embodiment of the invention, wherein a single-junction-bias (SJB) is applied to perform a once-bit-line (OBL) operation to concurrently program the memory cells $B_1$, $B_2$, $B_3$, $B_4$.

FIG. 3A-2 is a schematic circuit diagram of a programming operation for a NOR memory cell array according to an embodiment of the invention, wherein a double-junction-bias method is applied to perform the once-bit-line operation to concurrently program the memory cells $B_1$, $B_2$, $B_3$, $B_4$.

FIG. 3C-1 is a schematic circuit diagram of an erase operation for a NOR memory cell array according to an embodiment of the invention, wherein a single-junction bias method is used to perform the once-bit-line operation to concurrently erase the memory cells $B_1$, $B_2$, $B_3$, and $B_4$.

FIG. 3C-2 is a schematic circuit diagram of an erase operation for a NOR memory cell array according to an embodiment of the invention, wherein a double-junction bias method is used to perform the once-bit-line operation to concurrently erase the memory cells $B_1$, $B_2$, $B_3$, and $B_4$.

FIG. 3D-1 is a schematic circuit diagram of a sector erase operation, wherein a single-junction bias method is applied to sector erase a NOR memory cell array according to an embodiment of the invention.

FIG. 3D-2 is a schematic circuit diagram of a sector erase operation, wherein a double-junction-bias method is applied to sector erase a NOR memory cell array according to an embodiment of the invention.

FIG. 3D-3 is a schematic circuit diagram of a sector erase operation, wherein a negative Fowler-Nordheim electron tunneling effect to sector erase a NOR memory cell array according to an embodiment of the invention.

FIG. 4A-1 is a schematic circuit diagram of a programming operation for a multi-level cell array, wherein a single-junction-bias method is applied to perform the once-bit-line operation, and the memory cells $B_1$, $B_2$, $B_3$, and $B_4$ of a same column are concurrently programmed.

FIG. 4A-2 is a schematic circuit diagram of a programming operation of a multi-level cell array, wherein a dual-junction-bias is applied to perform the once-bit-line operation to concurrently program the memory cells $B_1$, $B_2$, $B_3$, $B_4$ of a same column.

DESCRIPTION OF EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
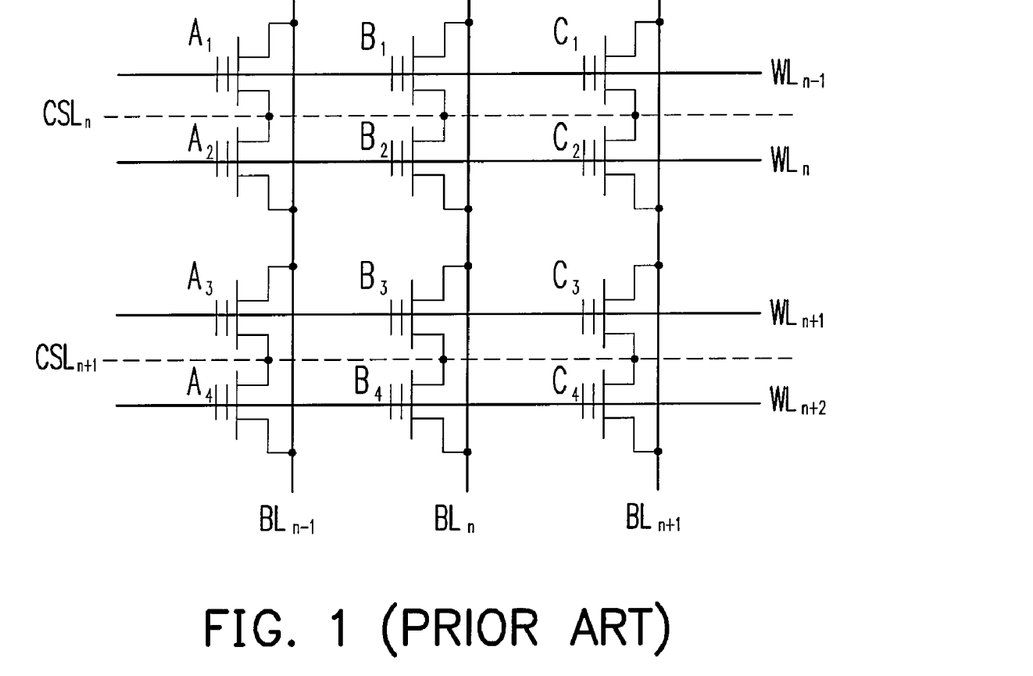
FIG. 1 is a schematic circuit diagram of a memory device according to the prior art.
Figure 2:
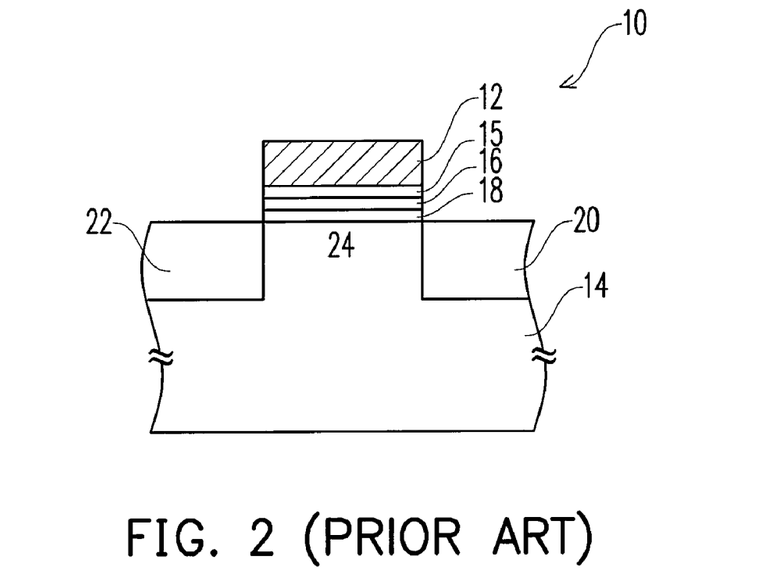
FIG. 2 is a schematic, cross-sectional view of the structure of a memory cell according to the prior art.

FIG. 1 is a schematic circuit diagram of a memory device according to the prior art. FIG. 2 is a schematic, cross-sectional view of the structure of a memory cell according to the prior art.

Referring to FIGS. 1 and 2, the memory device of the invention includes a plurality of memory cells configured in a memory cell array. The memory cell array is, for example, a NOR memory cell array formed with a plurality of memory cells, a plurality of bit lines, $BL_{n-1}$, $BL_n$, $BL_{n+1}$, ..., etc., and a plurality of word lines $WL_{n-1}$, $WL_n$, $WL_{n+1}$, $WL_{n+2}$, ..., etc. Each memory cell 10 may be a binary cell or a multilevel cell. Each memory cell 10 includes a substrate 14, a control gate 12, a charge storage layer 16, a drain region 20 and a source region 22. The drain region 20 and the source region 22 are configured in the substrate 14. The control gate 12 is disposed above the channel region 24 between the drain region 20 and the source region 22. The charge storage layer 16 is disposed between the substrate 14 and the control gate 12. The charge storage layer 16 is a dielectric layer, such as a silicon nitride layer or a conductive layer, such as a doped polysilicon layer. A tunneling dielectric layer 18 is also disposed between the charge storage layer 16 and the substrate 14. A material of the tunneling dielectric layer includes silicon oxide, for example. In the following embodiments, a SONOS memory cell is used to illustrate the charge storage layer 16 being a silicon nitride layer and a typical flash memory cell is used to illustrate the charge storage layer 16 being a conductive layer, such as a doped polysilicon layer. In the memory cell array, the memory cells, $A_1$, $A_2$, $A_3$ and $A_4$, the memory cells $B_1$, $B_2$, $B_3$, $B_4$, and memory cells $C_1$, $C_2$, $C_3$, $C_4$ are respectively arranged into one column. The memory cells $A_1$, $B_1$, $C_1$, the memory cells $A_2$, $B_2$, $C_2$, the memory cells $A_3$, $B_3$, $C_3$, the memory cells $A_4$, $B_4$, $C_4$ are respectively arranged into one row. The drain regions of the memory cells of the same column are connected with the bit line BL. For example, the drain regions of the memory cells $A_1$, $A_2$, $A_3$ and $A_4$, of the same column are connected with the bit line $BL_{n-1}$. The source regions of two neighboring memory cells of the same column are contiguous and commonly shared. Further, the source regions along the same row are connected with a common source line. For example, the source region 22 of the memory cell $A_1$ and the source region 22 of the memory cell $A_2$ are shared and are connected to the common source region 22 of the memory cell $B_1$ and $B_2$ that are respectively along the same rows of memory cell $A_1$ and memory cell $A_2$ via the common source line $CSL_n$. Moreover, in the memory cell array, the control gates 12 of the memory cells of a same row respectively correspond to a same word line, such as the control gates of the memory cells $A_1$, $B_1$, $C_1$ correspond to the same word line $WL_{n-1}$.

The programming of a memory cell adopts a once-bit-line programming method. The once-bit-line programming method is a one-operation per bit-line type of operating method, in which a single-junction-bias method or a double-junction-bias method is used to concurrently program memory cells of a same column/line such that the memory cells of a same column/line are respectively at the predetermined program state. During the erase operation, a once-bit-line erase method or a sector erase method may be adopted. The once-bit-line erase method is a one operation per bit line type of operating method, in which the memory cells of a same column/line are concurrently erased for the memory cells of the same column be respectively at the erase state via the single-junction-bias method, the double-junction-bias method. The sector erase operation may also adopt the single-junction-bias method, the double-junction-bias method or negative Fowler-Nordheim electron tunneling effect for all memory cells to be concurrently erased and at the erase state. During the reading of data, only the selected single memory cell is read.

Embodiment 1

In one embodiment, the memory cell 10, which can be a SONOS memory cell or a typical flash memory cell, can be divided into two states, for example, state (1) in which the threshold voltage is lower, and state (0) in which the threshold voltage is higher. In one embodiment, the lower threshold voltage state (1) is designated as an erase state, and the memory cell 10 can be re-programmed to a higher threshold voltage state (0). In other words, during the programming operation, a bias is generated between the drain region 20 and the source region 22 of the selected memory cell via the single-junction-bias method. Concurrently, a voltage is applied to all the word lines to program the memory cells of the same column into a (1) state or a (0) state. On the other hand, during programming, a same voltage to the drain region 20 and the source region 22 of the selected memory cell 10 via a double junction bias method, and a required voltage is concurrently applied to all the word lines to concurrently program the memory cells of a same column as the (1) state or the (0) state.

Figure 3A:
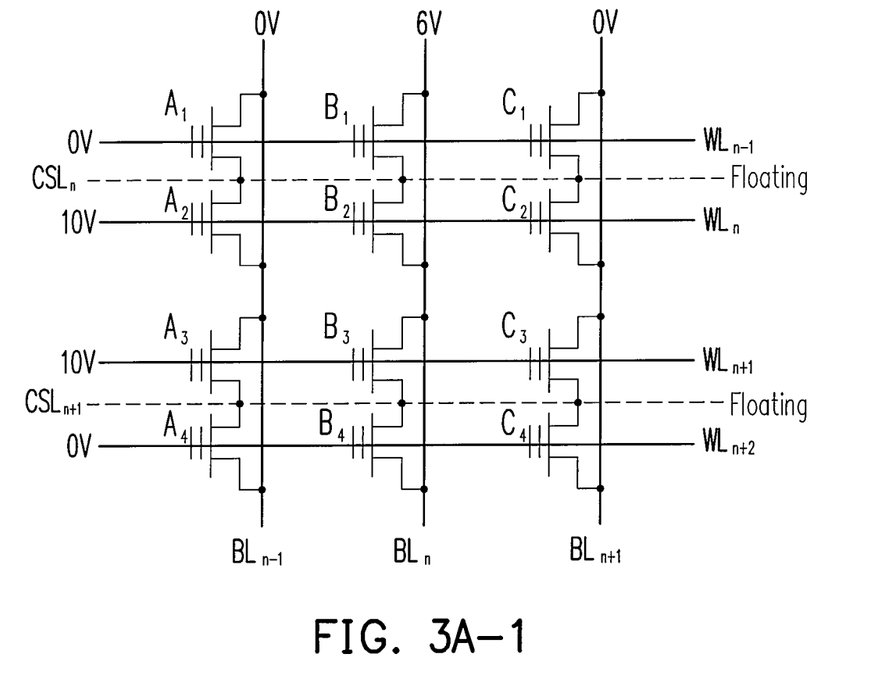

FIG. 3A-1 is a schematic circuit diagram of a programming operation for a NOR memory cell array according to an embodiment of the invention, wherein a single-junction-bias (SJB) is applied to perform a once-bit-line (OBL) operation to concurrently program the memory cells $B_1$, $B_2$, $B_3$, $B_4$.

Referring to FIG. 3A-1, assuming memory cell $B_1$, memory cell $B_2$, memory cell $B_3$ and memory cell $B_4$ are the selected memory cells, and the predetermined program states of these memory cells are respectively (1) state, (0) state, (0) state and (1) state. When a single-junction-bias method is used to concurrently program the memory cells $B_1$, $B_2$, $B_3$ and $B_4$ of a same column, 0 volt is applied to the substrate 14, and a voltage of 4 to 8 volts, for example, 6 volts, are applied to the corresponding bit line $BL_n$. Further, a same voltage, for example, 0 volt, is applied to other bit lines $BL_{n-1}$ and $BL_{n+1}$. The corresponding common source line $CSL_n$ of the common source region 22 of the memory cells $B_1$, $B_2$ and the corresponding common source line $CSL_{n+1}$ of the common source region 22 of the memory cells $B_3$ and $B_4$ are floating. Moreover, the corresponding word lines $WL_{n-1}$, $WL_n$, $WL_{n+1}$, $WL_{n+2}$ of the memory cells $B_1$, $B_2$, $B_3$ and $B_4$, are respectively applied with 0 volt, 10 volts, 10 volts and 0 volt. Under these operating conditions, the hot electrons generated at the junction of the drain regions of the memory cells B2 and B3 diffuse to the substrate 14. Further due to the effect of ionization, many electron-hole pairs are formed. The electrons in the electron-hole pairs are injected into the charge trapping layer 16 due to the attraction of the positive voltage being applied to the word lines $WL_n$, $WL_{n+1}$, for those memory cells to be at the higher threshold voltage state (0). The memory cells $B_1$ and $B_4$ are maintained at a lower threshold voltage state (1). Using a similar method, the memory cells of each column/line are concurrently programmed to the (0) state or the (1) state.

Figure 3A:
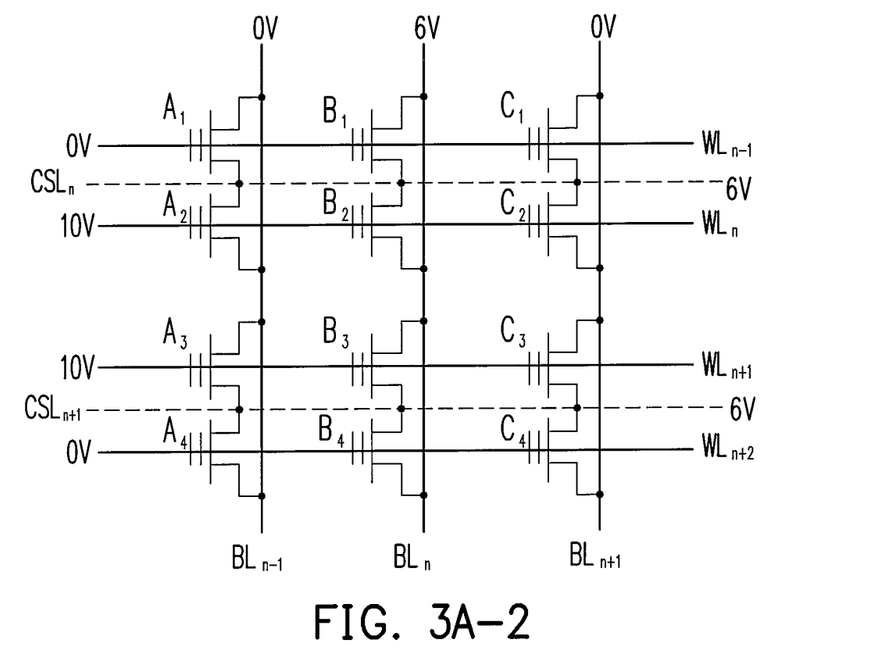

FIG. 3A-2 is a schematic circuit diagram of a programming operation for a NOR memory cell array according to an embodiment of the invention, wherein a double-junction-bias method is applied to perform the once-bit-line operation to concurrently program the memory cells $B_1$, $B_2$, $B_3$, $B_4$.

Referring to FIG. 3A-2, assuming memory cell $B_1$, memory cell $B_2$, memory cell $B_3$ and memory cell $B_4$ are the selected memory cells, and the predetermined program states of the memory cells are respectively (1) state, (0) state, (0) state and (1) state. When a double-junction-bias method is used to concurrently program the memory cells $B_1$, $B_2$, $B_3$ and $B_4$ of a same column, a voltage of 0 volt is applied to the substrate 14, and a voltage of 4 to 8 volts, for example, 6 volts, is applied to the corresponding bit line $BL_n$ of the drain regions of the memory cells $B_1$, $B_2$, $B_3$ and $B_4$, and a same voltage, for example 4 to 8 volts, such as, 6 volt, is applied to the corresponding common source lines $CSL_n$ and $CSL_{n+1}$ of the source regions 22. Further, a same voltage, for example 0 volt, is applied to other bit lines $BL_{n-1}$ and $BL_{n+1}$. Moreover, the corresponding word lines $WL_{n-1}$, $WL_n$, $WL_{n+1}$, $WL_{n+2}$ of the memory cells $B_1$, $B_2$, $B_3$ and $B_4$, are respectively applied with 0 volt, 10 volts, 10 volts and 0 volt. Under these operating conditions, the hot electrons generated at the junction of the source regions 22 and the drain regions 20 of the memory cells $B_2$ and $B_3$ diffuse to the substrate 14. Further due to the effect of ionization, many electron-hole pairs are formed. The electrons in the electron-hole pairs are injected into the charge trapping layer 16 due to the positive voltage being applied to the word lines $WL_n$, $WL_{n+1}$ for the memory cells $B_2$ and $B_3$ to be at the higher threshold voltage state (0). The memory cells $B_1$ and $B_4$ are maintained at a lower threshold voltage state (1). Using the same method, line-by-line, the memory cells of each column/line are concurrently programmed to the (0) state or the (1) state.

Figure 3B:
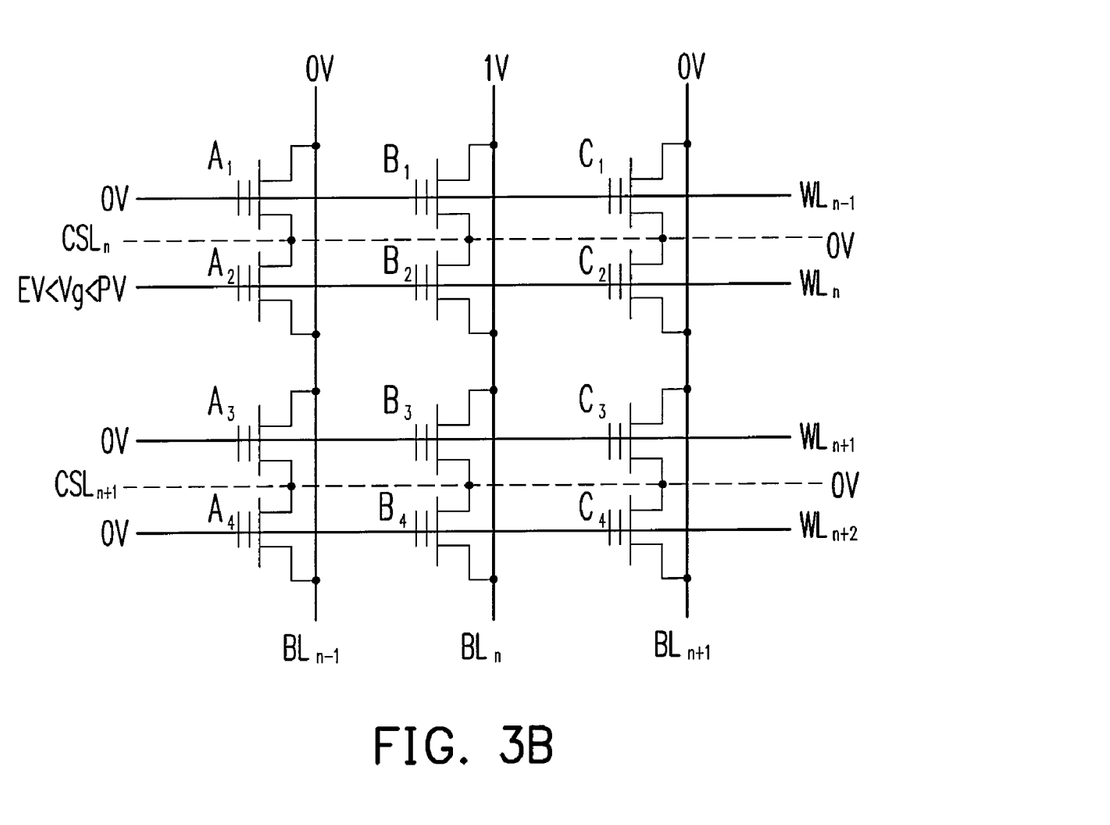
FIG. 3B is a schematic circuit diagram of a NOR memory cell array in which the data state of a selected memory cell $B_2$ is being read according to an embodiment of the invention.

Subsequent to the programming of the memory cell array, each memory cell is read using a conventional method. FIG. 3B is a schematic circuit diagram of a NOR memory cell array in which the data state of a selected memory cell $B_2$ is being read according to an embodiment of the invention.

Referring to FIG. 3B, during the state of reading the data of a selected memory cell $B_2$, a voltage $V_g$ between the program level (PV) and erase level (EV) is applied to the corresponding word line $WL_n$ of the control gate 12 of the memory cell $B_2$, and a voltage of 0 volt is applied to other word lines $WL_{n-1}$, $WL_{n+1}$ and $WL_{n+2}$. Further, a voltage of 1 volt is applied to the corresponding bit line $BL_n$ of the drain region 20 of the memory cell $B_2$, and a voltage of 0 volt is applied to the source region 22 of the memory cell $B_2$ and other bit lines $BL_{n-1}$ and $BL_{n+1}$. In this embodiment, the voltage $V_g$ applied to the corresponding word line $WL_n$ of the control gate 12 of the memory cell $B_2$ is smaller than the program level (PV). Hence, it is unable to open the control gate 12, and the current is undetected. Accordingly, the state of memory cell $B_2$ being the (0) state is detected.

During the reading of the data state of a selected memory cell $B_1$, a voltage $V_g$ between the program level and the erase level is applied to the corresponding word line $WL_{n-1}$ of the control gate 12 of the memory cell $B_1$, and a voltage of 0 volt is applied to other word lines $WL_n$, $WL_{n+1}$ and $WL_{n+2}$. Further, a voltage of 1 volt is applied to the corresponding bit line $BL_n$ of the drain region 20 of the memory cell $B_1$, and a voltage of 0 volt is applied to the source region 22 of the memory cell $B_1$ and other bit lines $BL_{n-1}$ and $BL_{n+1}$. The state of the memory cell $B_2$ is determined by the magnitude of the current being read. In this embodiment, the voltage $V_g$ being applied to the corresponding word line $WL_n$ of the control gate 12 of the memory cell $B_1$ is greater than the erase level, the control gate can be opened. Hence, the current is detected and the state of the memory cell $B_1$ is determined to be state (1).

Accordingly, the magnitude of current being read is used to determine the state of the memory cell being the state (1) or state (0).

Subsequent to the programming of the memory cell array, the single-junction-bias method or the double-junction-bias method or the negative Fowler-Nordheim electron tunneling effect is used to perform the once-bit-line operation to concurrently erase one column/line of memory cells in an erase operation.

In other words, by applying a single-junction-bias method to perform the once-bit-line erase operation, a voltage difference is generated between the source region 22 and the drain region 20 of the selected memory cell 10, and a negative voltage is applied to the corresponding word lines of the memory cells that have been programmed to a higher threshold voltage state. Concurrently, a voltage of 0 volt is applied to the corresponding word lines of the memory cells that have been (maintain at an erase state).

By applying the double-junction-bias method to perform the once-bit-line erase operation, a same bias is applied to the source region 22 and the drain region 20 of the selected memory cell 10, and a negative voltage is applied to the corresponding word lines of the memory cells that have been programmed to a higher threshold voltage state. Concurrently, a voltage of 0 volt is applied to the corresponding word lines of the memory cells that have been (maintain at an erase state).

Figure 3C:
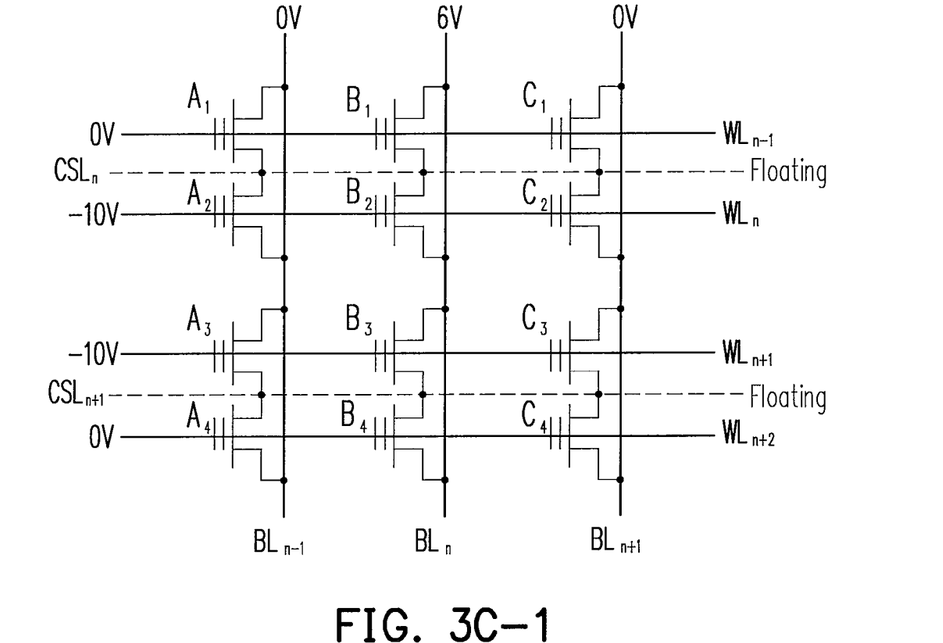

FIG. 3C-1 is a schematic circuit diagram of an erase operation for a NOR memory cell array according to an embodiment of the invention, wherein a single-junction bias method is used to perform the once-bit-line operation to concurrently erase the memory cells $B_1$, $B_2$, $B_3$, and $B_4$.

Referring to FIG. 3C-1, when the memory cell is a typical flash memory cell or a SONOS memory cell and assuming the memory cells $B_1$, $B_2$, $B_3$, and $B_4$ are respectively programmed to (1) state, (0) state, (0) state and (1) state, the single-junction-bias method is used during the erase operation, and a voltage of 0 volt is applied to the substrate 14, and a voltage, for example, 4 to 8 volts, such as 6 volts, is applied to the corresponding bit line $BL_n$, and a voltage of 0 volt, for example, is concurrently applied to other bit lines $BL_{n-1}$ and $BL_{n+1}$. The common source line $CSL_n$ coupling the common source region 22 of the memory cells $B_1$ and $B_2$, and the common source line $CSL_{n-1}$ coupling the common source region 22 of the memory cells $B_3$ and $B_4$ are floating. Moreover, the corresponding word lines $WL_{n-1}$, $WL_n$, $WL_{n+1}$ and $WL_{n+2}$ of the memory cells $B_1$, $B_2$, $B_3$, and $B_4$ are respectively applied with 0 volt, −10 volts, −10 volts and 0 volt. Under theses operating condition, the hot electrons generated at the junctions of the drain regions 20 of the memory cells $B_2$ and $B_3$ diffuse to the substrate 14. Further due to the effect of ionization, many electron-hole pairs are generated. The holes in the electron-hole pairs are injected into the charge trapping layer due to the negative charge being applied to the word lines $WL_n$, $WL_{n+1}$ to erase the memory cells $B_2$ and $B_3$ to a lower threshold voltage state (1), while the memory cells $B_1$ and $B_4$ are maintained at a lower threshold voltage state (1).

Figure 3C:
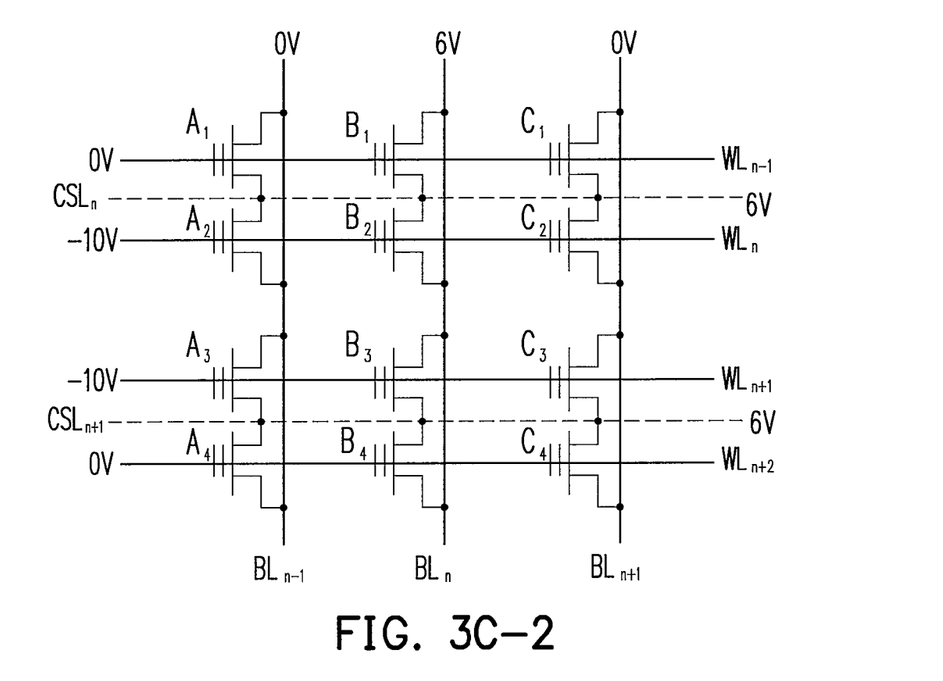

FIG. 3C-2 is a schematic circuit diagram of an erase operation for a NOR memory cell array according to an embodiment of the invention, wherein a double-junction bias method is used to perform the once-bit-line operation to concurrently erase the memory cells $B_1$, $B_2$, $B_3$, and $B_4$.

Referring to FIG. 3C-2, when the memory cell is a typical flash memory cell or a SONOS memory cell and assuming the memory cells $B_1$, $B_2$, $B_3$, and $B_4$ are respectively programmed to (1) state, (0) state, (0) state and (1) state, the double-junction-bias method is used to perform the once-bit-line method to erase the NOR gate memory cell array during an erase operation, which is a similar to the approach as described in FIG. 3C-1. The difference between this embodiment and the previous embodiment is that the corresponding bit line $BL_n$ of the drain regions of the memory cells $B_1$, $B_2$, $B_3$, and $B_4$ and the common source line $CSL_n$ coupling the common source region 22 of the memory cell $B_1$, $B_2$ and the common source line $CSL_{n+1}$ coupling the common source region 22 of the memory cell $B_3$ and $B_4$ are applied with a same voltage, for example, 4 to 8 volts, such as 6 volts. Under these operating conditions, the hot electrons generated at the junctions of the source region 22 or the drain region 20 of the memory cells $B_2$ or $B_3$ diffuse to the substrate 14. Further due to the effect of ionization, many electron-hole pairs are generated. The holes in the electron-hole pairs are injected into the charge trapping layer due to the negative charge being applied to the word lines $WL_n$, $WL_{n+1}$ to erase the memory cells $B_2$ and $B_3$ to a lower threshold voltage state (1), while the memory cells $B_1$ and $B_4$ are maintained at the lower threshold voltage state (1).

Subsequent to the programming operation of the memory cell array, the single-junction-bias method, the double-junction-bias method or the negative Fowler-Nordheim electron tunneling effect may be used during the erase operation to sector erase a sector of memory cells.

More particularly, when the single-junction-bias method is used to perform the sector erase operation, a bias is generated between the drain regions 20 and the source regions 22 of all the memory cells, and all word lines are applied with a negative voltage. When the double-side-junction-bias method is used to perform the sector erase operation, the drain regions 20 and the source regions 22 of all the memory cells are applied with a same bias, and all word lines are applied with a negative voltage. When the negative Fowler-Nordheim electron tunneling effect is used to perform the sector erase operation, all the memory cells 10 and their source regions 22 and the drain regions 20 are applied with 0 volt, and all the word lines are applied with a greater negative voltage.

Figure 3D:
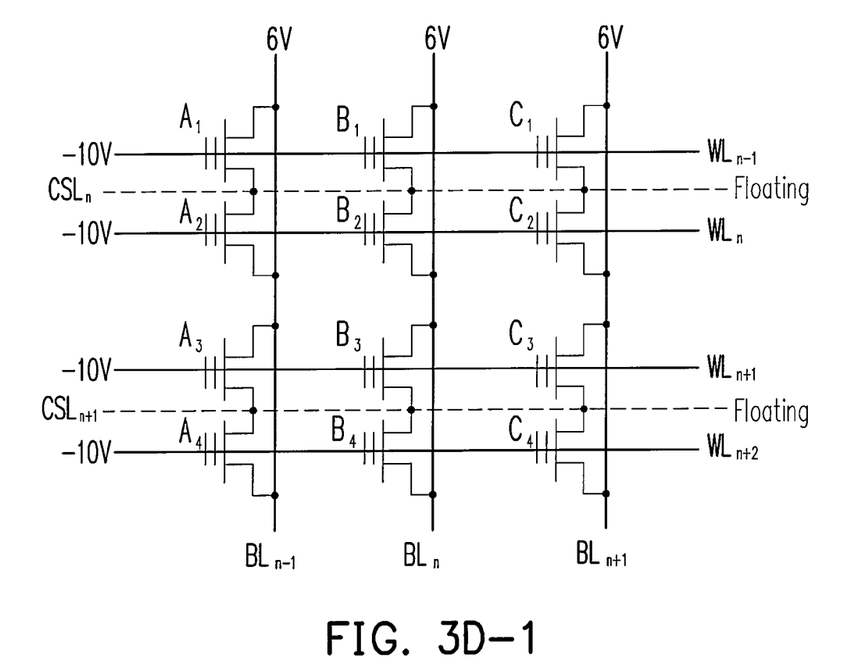

FIG. 3D-1 is a schematic circuit diagram of a sector erase operation, wherein a single-junction bias method is applied to sector erase a NOR gate memory cell array according to an embodiment of the invention.

Referring to FIG. 3D-1, when the memory cell is a typical flash memory cell or a SONOS memory cell and assuming the memory cells $B_1$, $B_2$, $B_3$, and $B_4$ are respectively programmed to (1) state, (0) state, (0) state and (1) state, the single-junction-bias method is used to perform the sector erase operation on the NOR memory cell array during the erase process. The erase operation includes applying 0 volt to the substrate 14, and applying a voltage, for example, 4 to 8 volts, such as 6 volts, to all the bit lines $BL_{n-1}$, $BL_n$ and $BL_{n+1}$, and all the common source lines $CSL_n$, $CSL_{n+1}$ are floating. Moreover, all the word lines $WL_{n-1}$, $WL_n$, $WL_{n+1}$ and $WL_{n+2}$ are respectively applied with −10 volts. Under these operating conditions, all the memory cells are erased to a lower threshold voltage state (1).

Figure 3D:
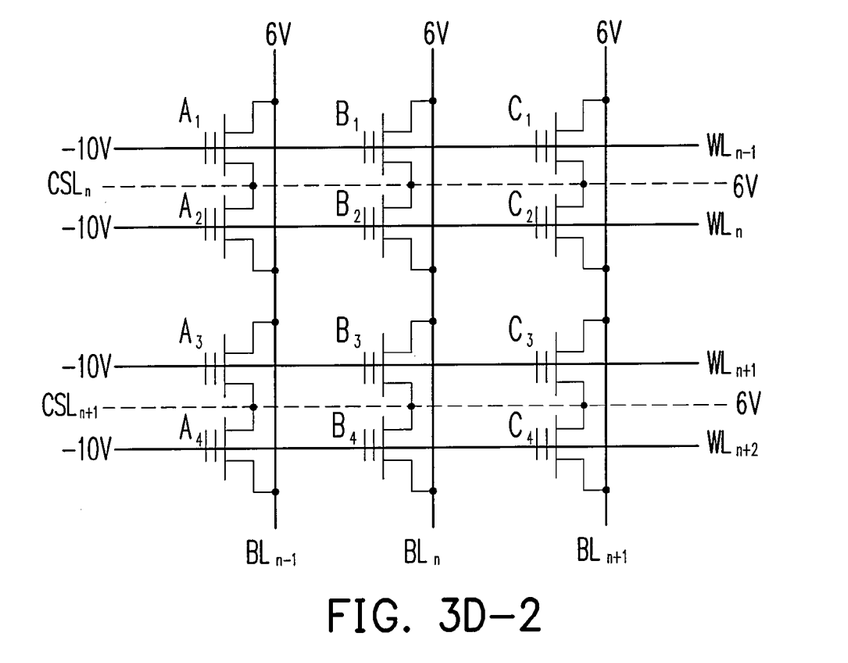
Figure 3D:
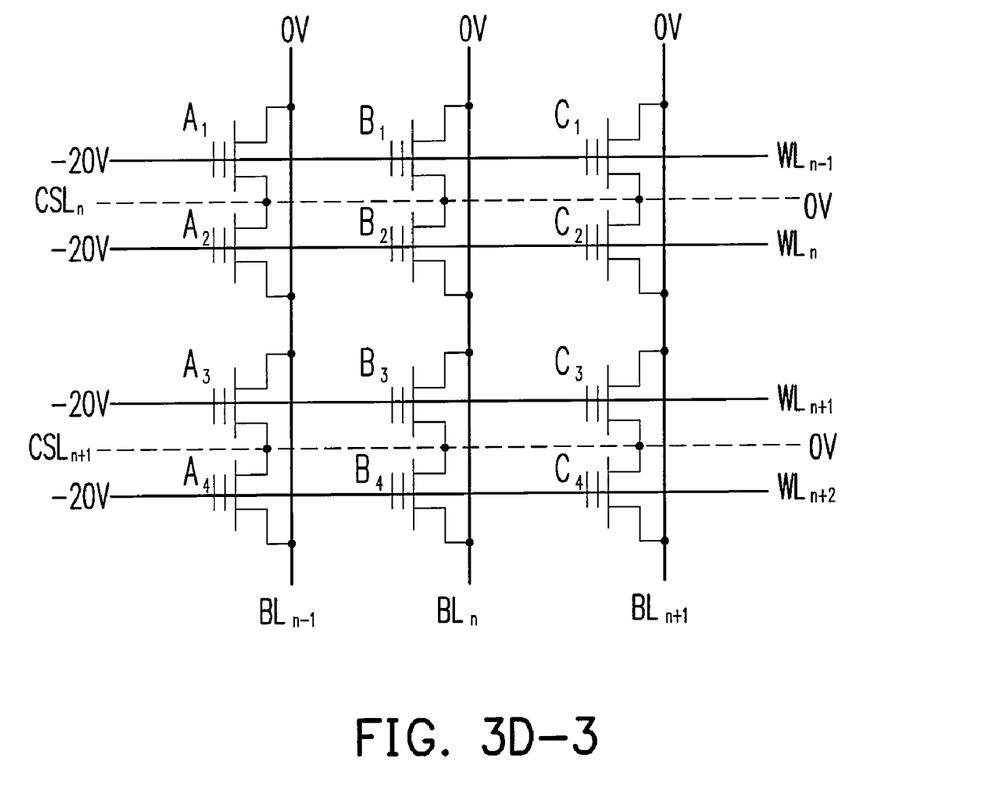

FIG. 3D-2 is a schematic circuit diagram of a sector erase operation, wherein a double junction-bias method is applied to sector erase a NOR memory cell array according to an embodiment of the invention.

Referring to FIG. 3D-2, when the memory cell is a typical flash memory cell or a SONOS memory cell and assuming the memory cells $B_1$, $B_2$, $B_3$, and $B_4$ are respectively programmed to (1) state, (0) state, (0) state and (1) state, the double-junction-bias method is used to perform the sector erase operation on the NOR memory cell array during the erase process, which is similar to the approach described above in FIG. 3D-1. The difference between this and the previous embodiments is that all the bit lines $BL_{n-1}$, $BL_n$ and $BL_{n+1}$ and all the common source lines $CSL_n$, $CSL_{n+1}$ are applied with a same voltage, for example, 4 to 8 volts, such as 6 volts. Under these operating conditions, all the memory cells are erased to a lower threshold voltage state (1).

FIG. 3D-3 is a schematic circuit diagram of a sector erase operation, wherein a negative Fowler-Nordheim electron tunneling effect to sector erase a NOR memory cell array according to an embodiment of the invention.

Referring to FIG. 3D-3, when the memory cell is a typical flash memory cell or a SONOS memory cell and assuming the memory cells $B_1$, $B_2$, $B_3$, and $B_4$ are respectively programmed to (1) state, (0) state, (0) state and (1) state, the negative Fowler-Nordheim electron tunneling effect is used to perform the sector erase operation during the erase operation. During the operation, 0 volt is applied to the substrate 14, and all the bit lines $BL_{n-1}$, $BL_n$ and $BL_{n+1}$ and all the common source lines $CSL_n$, $CSL_{n+1}$ are applied with 0 volt. Further, all the word lines $WL_{n-1}$, $WL_n$, $WL_{n+1}$ and $WL_{n+2}$ are respectively applied with −16 to −20 volts. Under these operating conditions, all the memory cells are erased to a lower threshold voltage state (1).

Embodiment 2

In another embodiment, the memory cell may be a typical flash memory cell or a SONOS memory cell, which can be a multi-level cell (MLC) divided into a plurality states according to the magnitude of the threshold voltage. For example, the multiple-level memory cell is divided into four states, sequentially from the smallest magnitude of (11) state, (10) state, (01) state and (00) state, according to the magnitude of the threshold voltage distribution. In one embodiment, the lowest threshold voltage state (11) is designated as the erase state, and the memory cell is re-programmed to higher threshold voltage (10) state, (01) state or (00) state. More particularly, during the programming operation, a bias is generated between the source region 22 and the drain region 20 of the selected memory cell 10 with the single-junction-bias method, and a voltage is concurrently applied to all the word lines to program the memory cells of the same column to (10) state, (01) state or (00) state. Alternatively, during the programming operation, a same voltage is applied to the drain region 20 and the source region 22 of the selected memory cell 10 with the double-junction-bias method, and a requisite voltage is concurrently applied to all the bit lines to program the memory cells of the same column to (10) state, (01) state or (00) state.

Figure 4A:
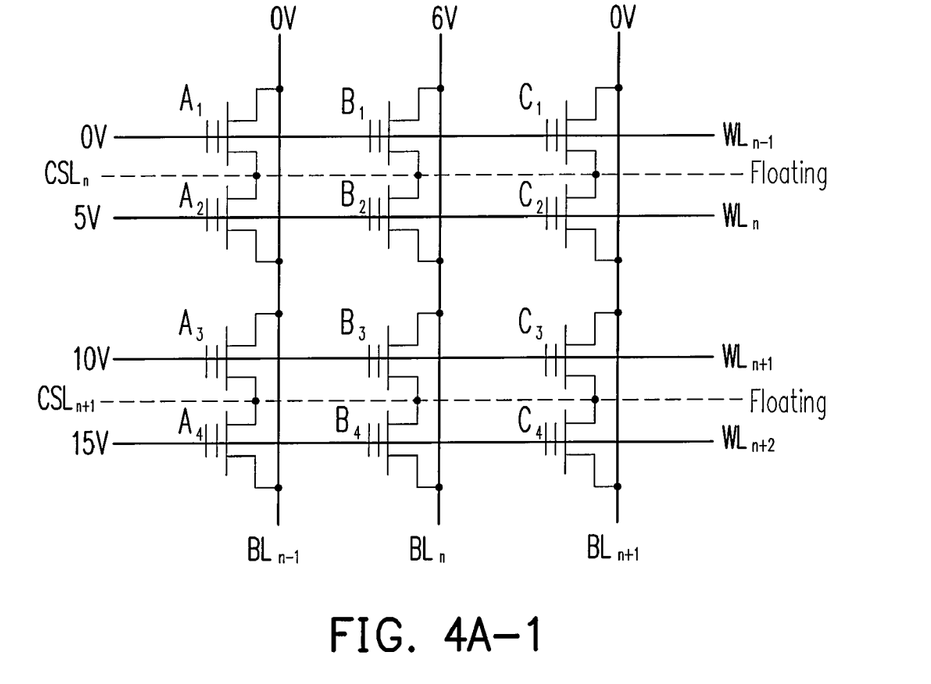

FIG. 4A-1 is a schematic circuit diagram of a programming operation for a multi-level cell NOR array, wherein a single-junction-bias method is applied to perform the once-bit-line operation, and the memory cells $B_1$, $B_2$, $B_3$, and $B_4$ of a same column are concurrently programmed.

Referring to FIG. 4A-1, assuming memory cell $B_1$, memory cell $B_2$, memory cell $B_3$ and memory cell $B_4$ are the selected memory cells, the predetermined program states of the memory cells are respectively (11) state, (10) state, (01) state and (00) state. When a single-junction-bias method is used to concurrently program the memory cells $B_1$, $B_2$, $B_3$ and $B_4$ of a same column, 0 volt is applied to the substrate 14, and a voltage of 4 to 8 volts, for example, 6 volts, are applied to the corresponding bit line $BL_n$. Further, a same voltage, for example 0 volt, is applied to other bit lines $BL_{n-1}$ and $BL_{n+1}$. The corresponding common source line $CSL_n$ of the common source region 22 of the memory cells $B_1$, $B_2$, and the corresponding common source line $CSL_{n+1}$ of the common source region 22 of the memory cells $B_3$ and $B_4$ are floating. Moreover, the corresponding word lines $WL_{n-1}$, $WL_n$, $WL_{n+1}$, $WL_{n+2}$ of the memory cells $B_1$, $B_2$, $B_3$ and $B_4$, are respectively applied with 0 volt, 5 volts, 10 volts and 15 volts. Under these operating conditions, the hot electrons generated at the junctions of the drain regions of the memory cells $B_1$, $B_2$, $B_3$ and $B_4$ diffuse to the substrate 14. Further due to the effect of ionization, many electron-hole pairs are formed. In the memory cells $B_2$, $B_3$ and $B_4$, the electrons in the electron-hole pairs are injected into the charge trapping layer 16 due to the attraction of the positive voltage being applied to the word lines $WL_n$, $WL_{n+1}$, $WL_{n+2}$ for the memory cells to respectively be at the higher threshold voltage (10) state, (01) state or (00) state. The memory cells $B_1$ is maintained at a lower threshold voltage (11) state.

Figure 4A:
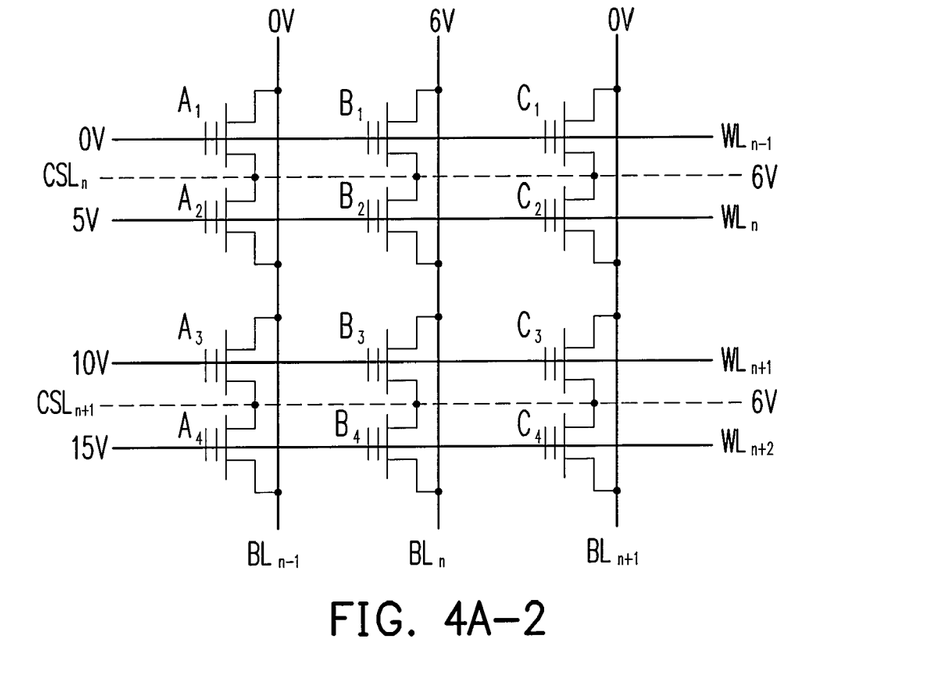

FIG. 4A-2 is a schematic circuit diagram of a programming operation of a multi-level cell NOR array, wherein a double-junction-bias method is applied to perform the once-bit-line operation to concurrently program the memory cells $B_1$, $B_2$, $B_3$, $B_4$ of a same column.

Referring to FIG. 4A-2, assuming memory cell $B_1$, memory cell $B_2$, memory cell $B_3$ and memory cell $B_4$ are the selected memory cells, in which the predetermined program states of the memory cells are respectively (11) state, (10) state, (01) state and (00) state. When a double-junction-bias method is used to concurrently program the memory cells $B_1$, $B_2$, $B_3$ and $B_4$ of a same column, 0 volt is applied to the substrate 14, and a voltage of 4 to 8 volts, for example, 6 volts, is applied to the corresponding bit line $BL_n$ of the drain regions 20 of the memory cells $B_1$, $B_2$, $B_3$ and $B_4$, and a same voltage, for example 4 to 8 volts, such as, 6 volts, is applied to the corresponding common source lines $CSL_n$ and $CSL_{n+1}$ of the source regions 22. Further, a same voltage, for example, 0 volt, is applied to other bit lines $BL_{n-1}$ and $BL_{n+1}$. Moreover, the corresponding word lines $WL_{n-1}$, $WL_n$, $WL_{n+1}$, $WL_{n+2}$ of the memory cells $B_1$, $B_2$, $B_3$ and $B_4$, are respectively applied with 0 volt, 5 volts, 10 volts and 15 volts. Under these operating conditions, the hot electrons generated at the junctions of the source region 22 and the drain region 20 of each of the memory cells $B_1$, $B_2$, $B_3$ and $B_4$ diffuse to the substrate 14. Further, due to the effect of ionization, many electron-hole pairs are formed. In the memory cells $B_2$, $B_3$ and $B_4$, the electrons in the electron-hole pairs are injected into the charge trapping layer 16 due to the attraction of the positive voltage being applied to the word lines $WL_n$, $WL_{n+1}$, $WL_{n+2}$ for the memory cells to be at the higher threshold voltage (11) state, (10) state, (01) state and (00) state. Using a similar method, Bit line-by-Bit line, the memory cells of each line are concurrently programmed to the (11) state, (10) state, (01) state and (00) state.

After the memory cells are being programmed, the program state of the selected MLC is read with a cell-by-cell method. Such a method is well known to a skilled artesian, and will not be further reiterated herein.

Subsequent to the programming of the MLC memory cell array, the single-junction-bias method or the double-junction-bias method or the negative Fowler-Nordheim electron tunneling effect may used to perform the once-bit-line operation to concurrently erase one column of the MLC memory cells during the erase operation. The method of using the single-junction-bias method or the double-side-junction-bias method or the negative Fowler-Nordheim electron tunneling effect to erase the MLC memory cells of a same column is similar to the above method of erasing the single-level memory cells of a same column.

Figure 5:
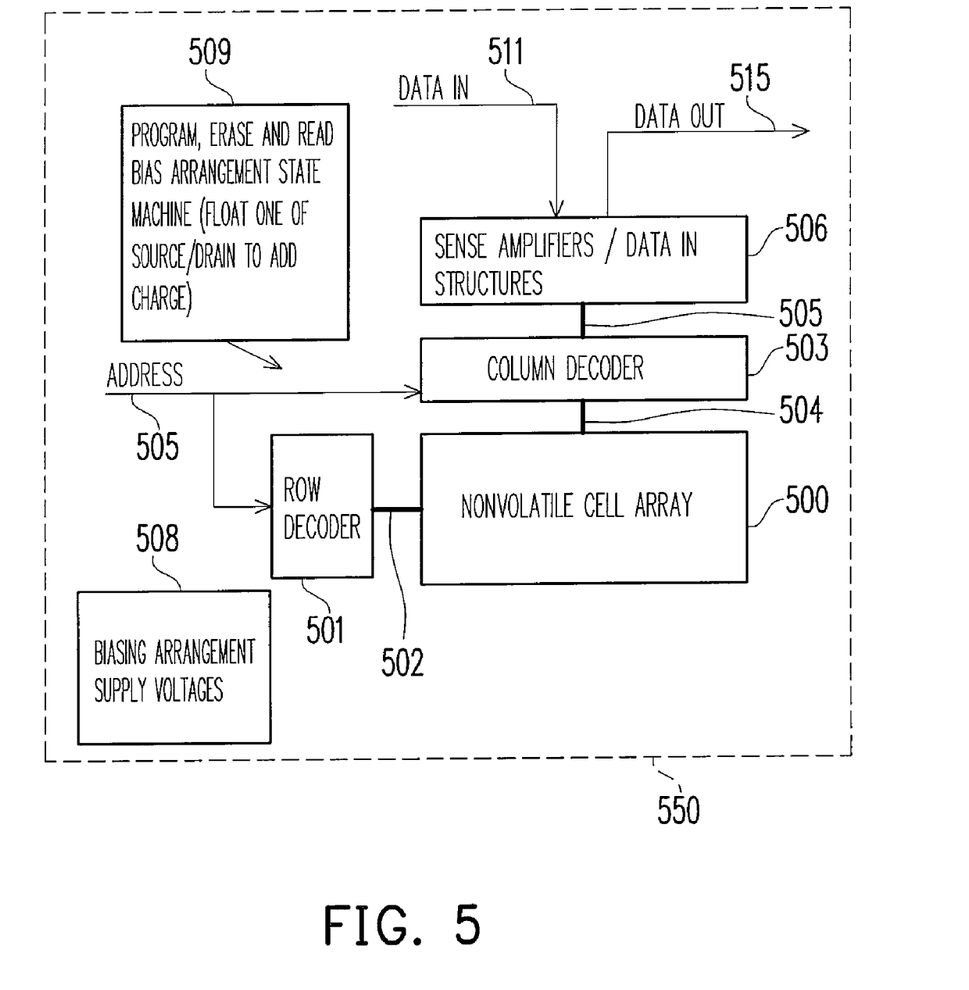
FIG. 5 is a block diagram of an exemplary nonvolatile memory integrated circuit with a bias arrangement control circuitry to float one of the source region or the drain region of one or more nonvolatile memory cells of a memory array.

FIG. 5 is a block diagram of an exemplary nonvolatile memory integrated circuit with a bias arrangement control circuitry of a memory array as disclosed herein. The integrated circuit 550 includes a memory array 500 of nonvolatile memory cells, on a semiconductor substrate. The memory cells of array 500 may be individual cells, interconnected in arrays, or interconnected in multiple arrays. A row decoder 501 is coupled to a plurality of word lines 502 arranged along rows in the memory array 500. A column decoder 503 is coupled to a plurality of bit lines 504 arranged along columns in the memory array 500. Addresses are supplied on bus 505 to column decoder 503 and row decoder 501. Sense amplifier and data-in structures 506 are coupled to the column decoder 503 via data bus 507. Data is supplied via the data-in line 511 from input/output ports on the integrated circuit 550, or from other data sources internal or external to the integrated circuit 550, to the data-in structures in block 506. Data is supplied via the data-out line 515 from the sense amplifiers in block 506 to input/output ports on the integrated circuit 550, or to other data destinations internal or external to the integrated circuit 550. A bias arrangement state machine 509 controls the application of bias arrangement supply voltages 508, such as for the erase verify and program verify voltages, and the arrangements for programming, erasing, and reading the memory cells, in particular floating one of the source region and drain region to add charge, as shown herein.

According to the programming method of the invention, by applying the single-junction-bias method or the double-junction-bias method to perform the programming or the erase operation, the problem of punch leakage current is mitigated.

During the programming operation of the present invention, a single line of the memory cells is concurrently programmed using the once-bit-line method. Hence, the problem of program disturbance can be mitigated.

During the programming operation of the present invention, the memory cells of a same line are programmed using the once-bit-line method, wherein all memory cells of a same line can be concurrently programmed. Hence, the programming time of a memory cell array is greatly reduced to increase productivity.

According to the present invention, the operating method is applicable to a code flash for programming data and a data flash for storing data. The code flash memory device is mainly responsible for providing the turn-on and program control of an electronic product; hence, it is mandated for a code flash to read and retrieve data rapidly. For example, a NOR Flash is a major product of a code flash. On the other hand, it is mandated for a data flash memory device to write data rapidly. For example, NAND Flash is a major product of a data flash.

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. An operating method of a memory array, the operating method comprising:
    performing a programming operation by applying a first voltage to a bit line of the memory array and a second voltage to a plurality of word lines of the memory array to simultaneously program a plurality of selected memory cells in the bit line, wherein the memory array has a plurality of common source lines, and when the programming operation is performed, the plurality of common source lines of the memory array is set floating.

2. The operating method of claim 1, wherein a single-junction-bias method is applied to perform the programming operation.

3. The operating method of claim 2, wherein the first voltage is a positive voltage.

4. The operating method of claim 1, wherein the memory cells are binary cells, and the above predetermined program states include two different threshold voltage distributions.

5. The operating method of claim 1, wherein the memory cells are multi-level cells, and the above predetermined program states are a plurality of program states having different threshold voltage distributions.

6. The operating method of claim 1, wherein the memory cell array is a NOR gate memory cell array.

7. The operating method of claim 1, wherein the memory cells are programmed Bit line-by-Bit line.

8. The operating method of claim 1, further comprising performing an erase operation to concurrently erase the selected memory cells.

9. The operating method of claim 8, wherein the erase operation includes an application of a single-junction-bias method, a double-junction-bias method or negative Fowler-Nordheim electron tunneling effect.

10. A circuit for operating memory array, comprising:
    a circuitry for performing a programming operation by applying a first voltage to a bit line of the memory array and a second voltage to a plurality of word lines of the memory array to simultaneously program a plurality of selected memory cells in the bit line, wherein the memory array has a plurality of common source lines, and the plurality of common source lines of the memory array is floated.

11. The memory circuit of claim 10, wherein the first voltage is a positive voltage.

12. The operating method of claim 10, wherein the memory cells are binary cells having two different threshold voltage distributions.

13. The memory circuit of claim 10, wherein the memory cells are multi-level cells having a plurality of program states with different threshold voltage distributions.

14. The memory circuit of claim 10, wherein the memory cell array is a NOR memory cell array.

15. The memory circuit of claim 10, wherein the memory cells are programmed Bit line-by-Bit line.

* * * * *